(12) United States Patent
Shamsian et al.

(10) Patent No.: US 10,373,454 B2
(45) Date of Patent: *Aug. 6, 2019

(54) SINGLE-ELEMENT DOOR/WINDOW OPENING DETECTOR

(71) Applicant: Tyco Fire & Security GmbH, Neuhausen am Rheinfall (CH)

(72) Inventors: Roni Shamsian, Holon (IL); Max Drankovsky, Ashkelon (IL); Alexander Shapira, Petach Tikva (IL)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/677,755

(22) Filed: Aug. 15, 2017

(65) Prior Publication Data

US 2019/0057585 A1    Feb. 21, 2019

(51) Int. Cl.
*G08B 13/08* (2006.01)
*G01B 7/02* (2006.01)
(Continued)

(52) U.S. Cl.
CPC ............ *G08B 13/08* (2013.01); *G01B 7/023* (2013.01); *G01D 5/2405* (2013.01); *G01V 3/12* (2013.01);
(Continued)

(58) Field of Classification Search
CPC .......... G08B 13/08; G08B 13/22; H04B 1/38
See application file for complete search history.

(56) References Cited

U.S. PATENT DOCUMENTS 8,659,428 B2 *   2/2014   Soto ..................... G08B 13/248
                                                          340/572.1
2005/0237198 A1 * 10/2005  Waldner ............. G06K 19/0707
                                                          340/572.7
(Continued)

FOREIGN PATENT DOCUMENTS

GB       1 603 376        11/1981
JP       H05-281172 A     10/1993
(Continued)

OTHER PUBLICATIONS

Search Report, dated Feb. 28, 2017, from GB Application No. 1700938.2, filed on Jan. 19, 2017. 4 pages.
(Continued)

*Primary Examiner* — Phung Nguyen
(74) *Attorney, Agent, or Firm* — Arent Fox LLP

(57) ABSTRACT

A door/window opening detector including an antenna having at least a first resonant frequency and a second resonant frequency associated therewith, the second resonant frequency being different from the first resonant frequency, the antenna having the first resonant frequency when in proximity to a door/window having a given dielectric constant and the second resonant frequency when not in proximity to a door/window having the given dielectric constant, and an alarm indication generator operable, in response to receiving an indication that a resonant frequency of the antenna has changed from the first resonant frequency to the second resonant frequency, for generating an alarm indication of opening of the door/window.

18 Claims, 3 Drawing Sheets

(51) Int. Cl.
    *G01V 3/12*      (2006.01)
    *G08B 13/24*     (2006.01)
    *H03B 28/00*     (2006.01)
    *H04B 1/38*      (2015.01)
    *G01D 5/24*      (2006.01)
    *H04B 1/04*      (2006.01)
    *H04B 17/10*     (2015.01)

(52) U.S. Cl.
    CPC .............. *G08B 13/24* (2013.01); *H03B 28/00* (2013.01); *H04B 1/0458* (2013.01); *H04B 1/38* (2013.01); *H04B 17/103* (2015.01)

(56) References Cited

U.S. PATENT DOCUMENTS

| | | | |
|---|---|---|---|
| 2006/0055534 A1* | 3/2006 | Fergusson | G01D 5/2405 340/562 |
| 2010/0026482 A1* | 2/2010 | Grichener | B64D 29/06 340/539.1 |
| 2010/0225482 A1 | 9/2010 | Kasai et al. | |
| 2012/0182147 A1 | 7/2012 | Forster | |
| 2013/0057252 A1 | 3/2013 | Kang | |
| 2015/0178529 A1* | 6/2015 | Theurer | G06K 7/10366 340/10.1 |
| 2015/0179053 A1* | 6/2015 | Good | A61B 5/6892 340/539.15 |
| 2016/0077029 A1 | 3/2016 | Dempster et al. | |
| 2018/0190092 A1 | 7/2018 | Shapira et al. | |

FOREIGN PATENT DOCUMENTS

| | | |
|---|---|---|
| WO | 2016060938 A2 | 4/2016 |
| WO | 2016/187283 A1 | 11/2016 |
| WO | 2017/183843 A1 | 10/2017 |

OTHER PUBLICATIONS

International Search Report and Written Opinion both dated Oct. 18, 2018, which issued during the prosecution of International Application No. PCT/IL2018/050817.

* cited by examiner

SINGLE-ELEMENT DOOR/WINDOW OPENING DETECTOR

FIELD OF THE INVENTION

The present invention relates generally to door/window opening detector elements and to single-element door/window opening detectors in particular.

BACKGROUND OF THE INVENTION

Commercially available door/window opening detector elements typically comprise two elements: a fixed sensor element mounted on the door/window frame and a fixed magnetic element mounted on the door/window, wherein detection of opening of the door/window is typically achieved by sensing the intensity of the magnetic field generated by the magnetic element mounted on the door/window by the sensor element mounted on the door/window frame. An intensity of the magnetic field which is lower than a pre-calibrated value is typically indicative of opening of the door/window.

The aforementioned arrangement requires a system comprising the installation of two elements, thereby increasing the complexity and cost associated with implementation of the system. There, therefore, arises a need for a single-element door/window opening detector.

SUMMARY OF THE INVENTION

The present invention seeks to provide a single-element door/window opening detector. There is thus provided in accordance with a preferred embodiment of the present invention an article proximity indicator including an antenna having at least a first resonant frequency and a second resonant frequency associated therewith, the second resonant frequency being different from the first resonant frequency, the antenna having the first resonant frequency when in proximity to an article having a given dielectric constant and the second resonant frequency when not in proximity to the article having the given dielectric constant, and a proximity indication generator operable, in response to receiving an indication that a resonant frequency of the antenna has changed from the first resonant frequency to the second resonant frequency, for generating an indication indicating that the antenna is not in proximity to the article.

Preferably, the article proximity indicator also includes a high frequency oscillator operable for generating a high frequency oscillating electromagnetic signal for excitation of the antenna. Preferably, the article proximity indicator also includes a high frequency coupler coupled to the high frequency oscillator and to the antenna and operable for transmitting the high frequency oscillating electromagnetic signal generated by the high frequency oscillator to the antenna, the antenna being operable for radiating the high frequency oscillating electromagnetic signal, and for receiving, from the antenna, a reflected electromagnetic signal, reflected to the antenna responsive to radiating the high frequency oscillating electromagnetic signal.

Preferably, the article proximity indicator also includes a high-frequency detector communicating with the high frequency coupler and operable for receiving the reflected electromagnetic signal from the high frequency coupler and for generating a direct electrical current corresponding to an intensity of the reflected electromagnetic signal. Preferably, the article proximity indicator also includes an analog to digital converter communicating with the high-frequency detector and operable for receiving the direct electrical current corresponding to the intensity of the reflected electromagnetic signal from the high-frequency detector and for converting the direct electrical current into a digital value corresponding to the intensity of the reflected electromagnetic signal.

Preferably, the proximity indication generator is also operable for receiving the digital value from the analog to digital converter and for ascertaining, based on the digital value corresponding to the intensity of the reflected electromagnetic signal, whether the resonant frequency of the antenna has changed from the first resonant frequency to the second resonant frequency.

There is thus further provided in accordance with another preferred embodiment of the present invention an article proximity detection method including receiving an indication of a measurement of a resonant frequency of an antenna, the antenna having at least a first resonant frequency and a second resonant frequency associated therewith, the second resonant frequency being different from the first resonant frequency, the antenna having the first resonant frequency when in proximity to an article having a given dielectric constant and having the second resonant frequency when not in proximity to the article having the given dielectric constant, and in response to receiving an indication that a resonant frequency of the antenna has changed from the first resonant frequency to the second resonant frequency, for generating an indication that the antenna is not in proximity to the article.

Preferably, the method also includes generating a high frequency oscillating electromagnetic signal for excitation of the antenna. Preferably, the method also includes transmitting the high frequency oscillating electromagnetic signal to the antenna, the antenna being operable for radiating the high frequency oscillating electromagnetic signal.

Preferably, the method also includes receiving, from the antenna, a reflected electromagnetic signal, reflected to the antenna responsive to the radiating the high frequency oscillating electromagnetic signal. Preferably, the method also includes generating a direct electrical current corresponding to an intensity of the reflected electromagnetic signal.

Preferably, the method also includes converting the direct electrical current into a digital value corresponding to the intensity of the reflected electromagnetic signal. Preferably, the method also includes ascertaining, based on the digital value corresponding to the intensity of the reflected electromagnetic signal, whether the resonant frequency of the antenna has changed from the first resonant frequency to the second first resonant frequency.

There is yet further provided in accordance with another preferred embodiment of the present invention a door/window opening detector including an antenna having at least a first resonant frequency and a second resonant frequency associated therewith, the second resonant frequency being different from the first resonant frequency, the antenna having the first resonant frequency when in proximity to a door/window having a given dielectric constant and the second resonant frequency when not in proximity to a door/window having the given dielectric constant, and an alarm indication generator operable, in response to receiving an indication that a resonant frequency of the antenna has changed from the first resonant frequency to the second resonant frequency, for generating an alarm indication of opening of the door/window.

Preferably, the door/window opening detector also includes a high frequency oscillator operable for generating a high frequency oscillating electromagnetic signal for excitation of the antenna. Preferably, the door/window opening detector also includes a high frequency coupler coupled to the high frequency oscillator and to the antenna and operable for transmitting the high frequency oscillating electromagnetic signal generated by the high frequency oscillator to the antenna, the antenna being operable for radiating the high frequency oscillating electromagnetic signal, and for receiving, from the antenna, a reflected electromagnetic signal, reflected to the antenna responsive to radiating the high frequency oscillating electromagnetic signal.

Preferably, the door/window opening detector also includes a high-frequency detector communicating with the high frequency coupler and operable for receiving the reflected electromagnetic signal from the high frequency coupler and for generating a direct electrical current corresponding to an intensity of the reflected electromagnetic signal. Preferably, the door/window opening detector also includes an analog to digital converter communicating with the high-frequency detector and operable for receiving the direct electrical current corresponding to the intensity of the reflected electromagnetic signal from the high-frequency detector and for converting the direct electrical current into a digital value corresponding to the intensity of the reflected electromagnetic signal.

Preferably, the alarm indication generator is also operable for receiving the digital value from the analog to digital converter, and for ascertaining, based on the digital value corresponding to the intensity of the reflected electromagnetic signal, whether the resonant frequency of the antenna has changed from the first resonant frequency to the second resonant frequency. Preferably, the alarm indication generator is also operable for transmitting the alarm indication of the opening of the door/window to a premises monitoring system operable for monitoring a premises of the door/window.

There is yet further provided in accordance with yet another preferred embodiment of the present invention a door/window opening detection method including receiving an indication of a measurement of a resonant frequency of an antenna, the antenna having at least a first resonant frequency and a second resonant frequency associated therewith, the second resonant frequency being different from the first resonant frequency, the antenna having the first resonant frequency when in proximity to a door/window having a given dielectric constant and having the second resonant frequency when not in proximity to the door/window having the given dielectric constant, and in response to receiving an indication that a resonant frequency of the antenna has changed from the first resonant frequency to the second resonant frequency, generating an alarm indication of opening of the door/window.

Preferably, the method also includes generating a high frequency oscillating electromagnetic signal for excitation of the antenna. Preferably, the method also includes transmitting the high frequency oscillating electromagnetic signal to the antenna, the antenna being operable for radiating the high frequency oscillating electromagnetic signal.

Preferably, the method also includes receiving, from the antenna, a reflected electromagnetic signal, reflected to the antenna responsive to the radiating the high frequency oscillating electromagnetic signal. Preferably, the method also includes generating a direct electrical current corresponding to an intensity of the reflected electromagnetic signal.

Preferably, the method also includes converting the direct electrical current into a digital value corresponding to the intensity of the reflected electromagnetic signal. Preferably, the method also includes ascertaining, based on the digital value corresponding to the intensity of the reflected electromagnetic signal, whether the resonant frequency of the antenna has changed from the first resonant frequency to the second resonant frequency.

Preferably, the method also includes transmitting the alarm indication of the opening of the door/window to a premises monitoring system operable for monitoring a premises of the door/window.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1A:
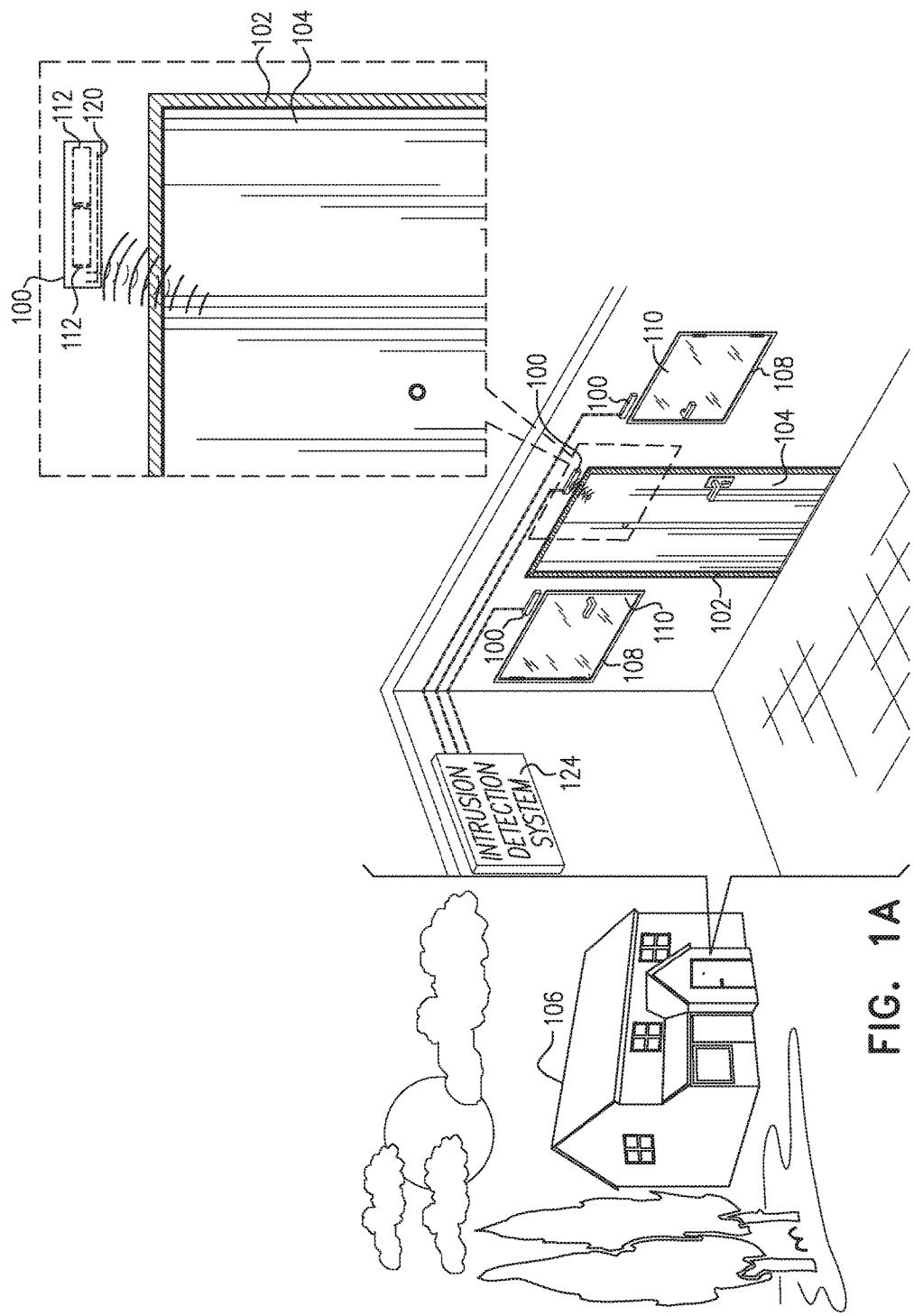
FIGS. 1A and 1B are simplified illustrations of a single-element door/window opening detector, constructed and operative in accordance with a preferred embodiment of the present invention.
Figure 1B:
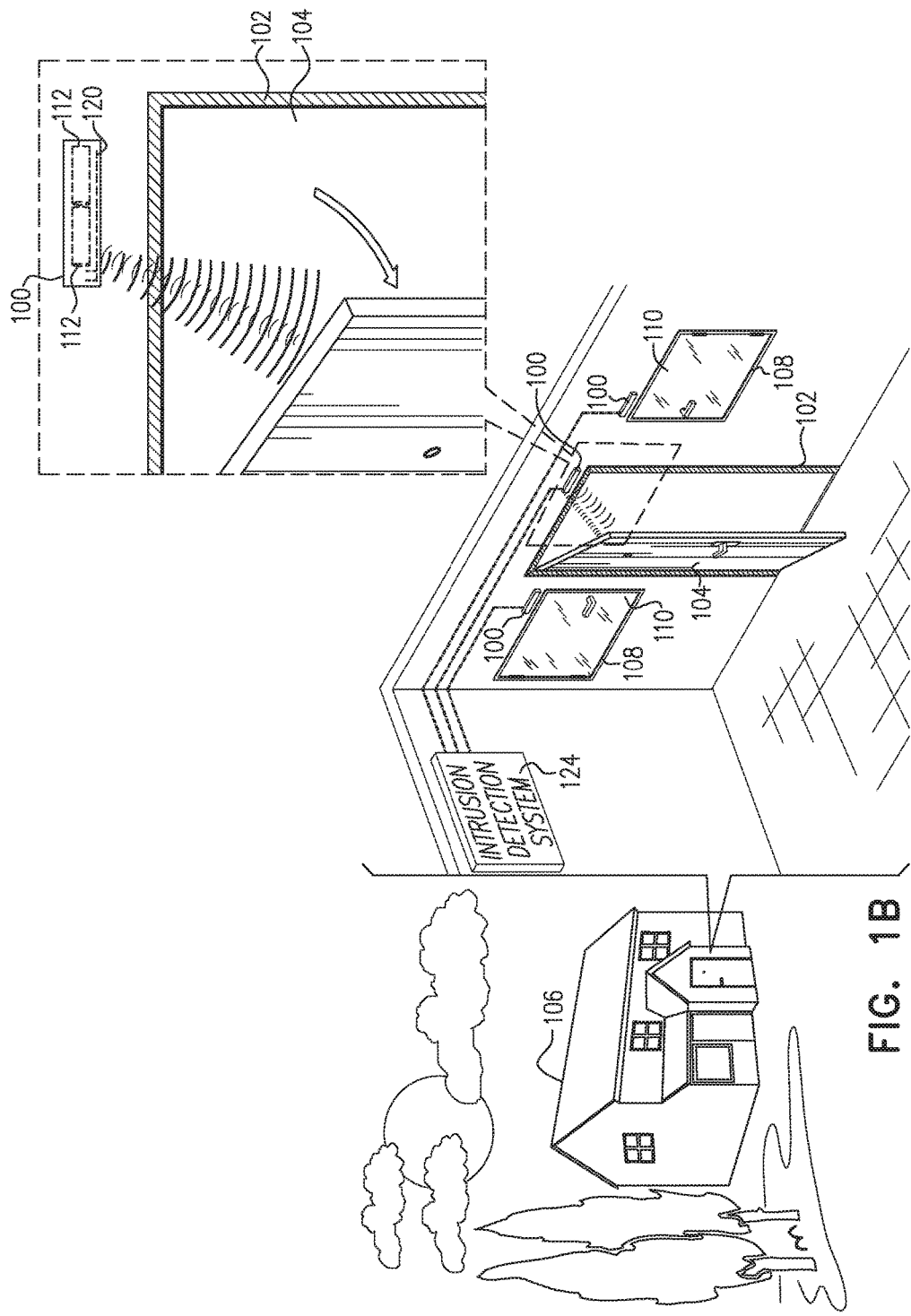

Reference is now made to FIGS. 1A and 1B, which are simplified illustrations of a single-element door/window opening detector, constructed and operative in accordance with a preferred embodiment of the present invention.

As shown in FIGS. 1A and 1B, there is provided a single-element door/window opening detector 100 which is preferably mounted, for example, on a frame 102 of a door 104 of premises 106, thereby being positioned to detect opening of door 104. As further shown in FIG. 1A, door/window opening detector 100 may be alternatively mounted on a frame 108 of window 110 of premises 106, thereby being positioned to detect opening of window 110. It is appreciated that door 104 and window 110 are each made of a material having a corresponding given dielectric constant. Single-element door/window opening detector 100 is preferably powered by a power source such as, for example, one or more batteries 112.

As further shown in FIGS. 1A and 1B, single-element door/window opening detector 100 preferably includes an antenna 120. Antenna 120 is preferably a quarter wavelength, inverted-F type antenna having at least a first resonant frequency when in proximity to door 104 made of a material having a given dielectric constant and a second resonant frequency when not in proximity to door 104.

It is appreciated that the resonant frequency of an antenna typically corresponds to the intensity of power reflected to the antenna by objects residing in the immediate vicinity of the antenna. It is further appreciated that the intensity of power reflected to an antenna by objects residing in the immediate vicinity of the antenna typically corresponds to the dielectric constant of the material comprising the reflecting objects in the immediate vicinity of the antenna.

In particular, in the case illustrated in FIG. 1A where door 104 is closed and is in proximity to antenna 120 of detector 100, the intensity of the power reflected by closed door 104 back to antenna 120 is greater than the intensity of the power reflected by closed door 104 back to antenna 120 in the case illustrated in FIG. 1B where door 104 is opened and is not in proximity to antenna 120 of detector 100.

It is therefore a particular feature of the present invention that by measuring an intensity of power reflected back to antenna 120, single-element door/window opening detector 100 is operable for ascertaining changes in proximity of an object having a particular dielectric constant to antenna 120, such as the proximity of door 104 to single-element door/window opening detector 100 mounted on frame 102, thereby ascertaining whether door 104 is open or closed. Single-element door/window opening detector 100 is preferably operable for communicating an alarm indication of opening of door 104 to a suitable intrusion detection system 124. It is appreciated that single-element door/window opening detector 100 may communicate with intrusion detection system 124 by wired or wireless communication.

Figure 2:
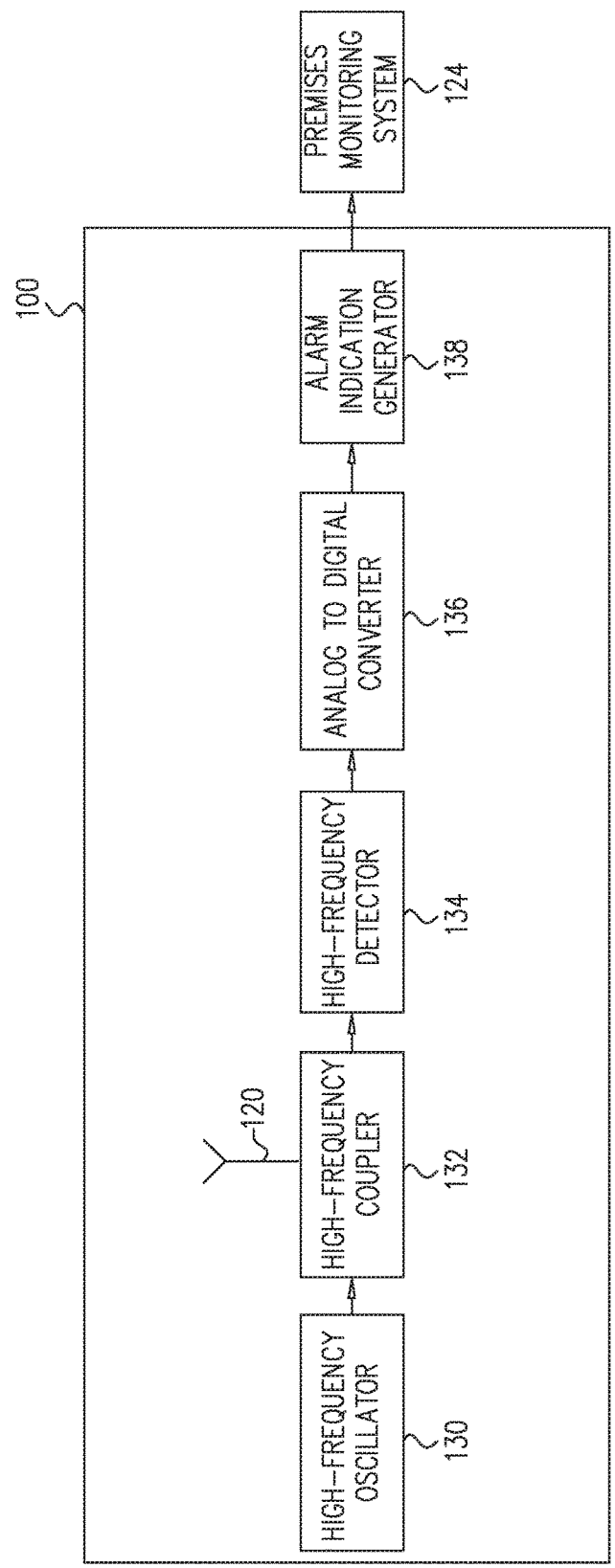
FIG. 2 is a simplified block diagram illustration of the single-element door/window opening detector of FIGS. 1A and 1B.

Reference is now made to FIG. 2, which is a simplified block diagram illustration of the single-element door/window opening detector of FIGS. 1A and 1B. As described hereinabove with reference to FIGS. 1A and 1B, single-element door/window opening detector 100 is preferably mounted, for example, on a frame of a door or of a window of a premises, thereby being positioned to detect opening of the door or of the window. It is appreciated that, typically, a door and a window are each made of a material having a corresponding given dielectric constant.

As further described hereinabove, single-element door/window opening detector 100 preferably includes an antenna 120. Antenna 120 is preferably a quarter wavelength, inverted-F type antenna. It is appreciated that antenna 120 preferably has a first resonant frequency when in proximity to a door made of a material having a given dielectric constant and a second resonant frequency when not in proximity to the door.

It is a particular feature of the present invention that single-element door/window opening detector 100 is operable, responsive to detecting changes in the resonant frequency of antenna 120, for ascertaining changes in proximity of single-element door/window opening detector 100 to a door and thereby for ascertaining that the door has been opened.

Single-element door/window opening detector 100 also preferably includes a high frequency oscillator 130 operable for generating a high frequency oscillating electromagnetic signal for excitation of antenna 120. A high frequency coupler 132 is preferably provided for transmitting the high frequency oscillating electromagnetic signal generated by high frequency oscillator 130 to antenna 120 and for receiving, from antenna 120, a reflected electromagnetic signal reflected to antenna 120 responsive to radiating the high frequency oscillating electromagnetic signal.

A high-frequency detector 134 communicating with high frequency coupler 132 is preferably operable for receiving the reflected electromagnetic signal from high frequency coupler 132 and for generating a direct electrical current corresponding to an intensity of the reflected electromagnetic signal.

An analog to digital converter 136 is preferably provided for receiving the direct electrical current from high-frequency detector 134 and for converting the direct electrical current into a digital value corresponding to the intensity of the reflected electromagnetic signal.

Single-element door/window opening detector 100 also preferably includes an alarm indication generator 138 which is preferably operable for receiving the digital value from analog to digital converter 136 and for ascertaining, based on the digital value corresponding to the intensity of the reflected electromagnetic signal, whether the resonant frequency of antenna 120 has changed from the first resonant frequency to the second resonant frequency, and that, therefore, antenna 120 is not in proximity to the door or window of the premises.

As described hereinabove, it is appreciated that the resonant frequency of an antenna typically corresponds to the intensity of power reflected to the antenna by objects residing in the immediate vicinity of the antenna. It is further appreciated that the intensity of power reflected to an antenna by objects residing in the immediate vicinity of the antenna typically corresponds to the dielectric constant of the material comprising the reflecting objects in the immediate vicinity of the antenna.

It is therefore a particular feature of the present invention that by measuring an intensity of power reflected back to antenna 120, single-element door/window opening detector 100 is operable for ascertaining changes in proximity of an object having a particular dielectric constant to antenna 120, such as the proximity of a door to single-element door/window opening detector 100 mounted on a frame, thereby ascertaining whether the door 104 is open or closed.

Alarm indication generator 138 is preferably also operable for communicating an alarm indication of opening of the door to a suitable intrusion detection system 124. It is appreciated that single-element door/window opening detector 100 may communicate with intrusion detection system 124 by wired or wireless communication.

It will be appreciated by persons skilled in the art that the present invention is not limited by what has been particularly shown and described hereinabove. Rather the scope of the present invention includes both combinations and subcombinations of the various features described hereinabove as well as modifications thereof which would occur to persons skilled in the art upon reading the foregoing description and which are not in the prior art.

The invention claimed is:

1. An article proximity indicator, comprising:
    an antenna having at least a first resonant frequency and a second resonant frequency associated therewith, said second resonant frequency being different from said first resonant frequency, said antenna having said first resonant frequency when in proximity to an article having a given dielectric constant and having said second resonant frequency when not in proximity to said article having said given dielectric constant;
    a high-frequency detector operable for generating a direct electrical current corresponding to an intensity of a reflected electromagnetic signal received from said antenna;
    an analog to digital converter communicating with said high-frequency detector and operable for receiving said direct electrical current corresponding to said intensity of said reflected electromagnetic signal from said high-frequency detector and for converting said direct electrical current into a digital value corresponding to said intensity of said reflected electromagnetic signal; and
    a proximity indication generator operable:
        for receiving said digital value from said analog to digital converter;
        for ascertaining, based on said digital value corresponding to said intensity of said reflected electromagnetic signal, whether a resonant frequency of said antenna has changed from said first resonant frequency to said second resonant frequency; and
        in response to ascertaining that said resonant frequency of said antenna has changed from said first resonant frequency to said second resonant frequency, for generating an indication indicating that said antenna is not in proximity to said article.

2. The article proximity indicator according to claim 1 and also comprising a high frequency oscillator operable for generating a high frequency oscillating electromagnetic signal for excitation of said antenna.

3. The article proximity indicator according to claim 2 and also comprising a high frequency coupler coupled to said high frequency oscillator and to said antenna and operable:
   for transmitting said high frequency oscillating electromagnetic signal generated by said high frequency oscillator to said antenna, said antenna being operable for radiating said high frequency oscillating electromagnetic signal; and
   for receiving, from said antenna, said reflected electromagnetic signal, reflected to said antenna responsive to said radiating said high frequency oscillating electromagnetic signal.

4. The article proximity indicator according to claim 3 and wherein said high-frequency detector is operable:
   for communicating with said high frequency coupler; and
   for receiving said reflected electromagnetic signal from said high frequency coupler.

5. An article proximity detection method, comprising:
   receiving a first indication of a measurement of a resonant frequency of an antenna, said antenna having at least a first resonant frequency and a second resonant frequency associated therewith, said second resonant frequency being different from said first resonant frequency, said antenna having said first resonant frequency when in proximity to an article having a given dielectric constant and having said second resonant frequency when not in proximity to said article having said given dielectric constant;
   generating a direct electrical current corresponding to an intensity of a reflected electromagnetic signal received from said antenna;
   converting said direct electrical current into a digital value corresponding to said intensity of said reflected electromagnetic signal;
   ascertaining, based on said digital value corresponding to said intensity of said reflected electromagnetic signal, whether said resonant frequency of said antenna has changed from said first resonant frequency to said second first resonant frequency; and
   in response to ascertaining that said resonant frequency of said antenna has changed from said first resonant frequency to said second resonant frequency, for generating a second indication indicating that said antenna is not in proximity to said article.

6. The article proximity detection method according to claim 5 and also comprising generating a high frequency oscillating electromagnetic signal for excitation of said antenna.

7. The article proximity detection method according to claim 6 and also comprising transmitting said high frequency oscillating electromagnetic signal to said antenna, said antenna being operable for radiating said high frequency oscillating electromagnetic signal.

8. The article proximity detection method according to claim 7 and also comprising receiving, from said antenna, said reflected electromagnetic signal, reflected to said antenna responsive to said radiating said high frequency oscillating electromagnetic signal.

9. A door\window opening detector, comprising:
   an antenna having at least a first resonant frequency and a second resonant frequency associated therewith, said second resonant frequency being different from said first resonant frequency, said antenna having said first resonant frequency when in proximity to a door\window having a given dielectric constant and having said second resonant frequency when not in proximity to a door\window having said given dielectric constant;
   a high-frequency detector operable for generating a direct electrical current corresponding to an intensity of a reflected electromagnetic signal received from said antenna;
   an analog to digital converter communicating with said high-frequency detector and operable for receiving said direct electrical current corresponding to said intensity of said reflected electromagnetic signal from said high-frequency detector and for converting said direct electrical current into a digital value corresponding to said intensity of said reflected electromagnetic signal; and
   an alarm indication generator operable:
      for receiving said digital value from said analog to digital converter; and
      for ascertaining, based on said digital value corresponding to said intensity of said reflected electromagnetic signal, whether a resonant frequency of said antenna has changed from said first resonant frequency to said second first resonant frequency; and
      in response to ascertaining that said resonant frequency of said antenna has changed from said first resonant frequency to said second resonant frequency, for generating an alarm indication of opening of said door\window.

10. The door\window opening detector according to claim 9 and also comprising a high frequency oscillator operable for generating a high frequency oscillating electromagnetic signal for excitation of said antenna.

11. The door\window opening detector according to claim 10 and also comprising a high frequency coupler coupled to said high frequency oscillator and to said antenna and operable:
    for transmitting said high frequency oscillating electromagnetic signal generated by said high frequency oscillator to said antenna, said antenna being operable for radiating said high frequency oscillating electromagnetic signal; and
    for receiving, from said antenna, said reflected electromagnetic signal, reflected to said antenna responsive to said radiating said high frequency oscillating electromagnetic signal.

12. The door\window opening detector according to claim 11 and wherein said high-frequency detector is operable:
    for communicating with said high frequency coupler; and
    for receiving said reflected electromagnetic signal from said high frequency coupler.

13. The door\window opening detector according to claim 9 and wherein said alarm indication generator is also operable for transmitting said alarm indication of said opening of said door\window to a premises monitoring system operable for monitoring a premises of said door\window.

14. A door\window opening detection method, comprising:
    receiving an indication of a measurement of a resonant frequency of an antenna, said antenna having at least a first resonant frequency and a second resonant frequency associated therewith, said second resonant frequency being different from said first resonant frequency, said antenna having said first resonant frequency when in proximity to a door\window having a given dielectric constant and having said second resonant frequency when not in proximity to said door\window having said given dielectric constant;

generating a direct electrical current corresponding to an intensity of a reflected electromagnetic signal received from said antenna;

converting said direct electrical current into a digital value corresponding to said intensity of said reflected electromagnetic signal;

ascertaining, based on said digital value corresponding to said intensity of said reflected electromagnetic signal, whether said resonant frequency of said antenna has changed from said first resonant frequency to said second first resonant frequency; and in response to ascertaining that said resonant frequency of said antenna has changed from said first resonant frequency to said second resonant frequency, generating an alarm indication of an opening of said door\window.

15. The door\window opening detection method according to claim 14 and also comprising generating a high frequency oscillating electromagnetic signal for excitation of said antenna.

16. The door\window opening detection method according to claim 15 and also comprising transmitting said high frequency oscillating electromagnetic signal to said antenna, said antenna being operable for radiating said high frequency oscillating electromagnetic signal.

17. The door\window opening detection method according to claim 16 and also comprising receiving, from said antenna, said reflected electromagnetic signal, reflected to said antenna responsive to said radiating said high frequency oscillating electromagnetic signal.

18. The door\window opening detection method according to claim 14 and also comprising transmitting said alarm indication of said opening of said door\window to a premises monitoring system operable for monitoring a premises of said door\window.

* * * * *